United States Patent [19]

Clark et al.

[11] 4,184,122
[45] Jan. 15, 1980

[54] DIGITAL PHASE COMPARISON APPARATUS

[75] Inventors: Michael A. G. Clark, Crawley Down; Michael J. Underhill, Faygate, both of England

[73] Assignee: U.S. Philips Corporation, New York, N.Y.

[21] Appl. No.: 868,978

[22] Filed: Jan. 12, 1978

[30] Foreign Application Priority Data

Jan. 24, 1977 [GB] United Kingdom ............... 2743/77

[51] Int. Cl.² .................. H03D 3/02; H03B 3/04
[52] U.S. Cl. ........................ 328/133; 331/1 A; 324/83 D; 328/155
[58] Field of Search ............ 328/133, 134, 155; 331/1 A; 324/83 D

[56] References Cited

U.S. PATENT DOCUMENTS

| | | | |
|---|---|---|---|
| 3,430,148 | 2/1969 | Miki | 328/133 |
| 3,548,321 | 12/1970 | Duquesne | 328/133 |
| 3,588,710 | 6/1971 | Masters | 328/133 |
| 3,600,690 | 8/1971 | White | 328/133 |
| 3,866,129 | 2/1975 | Cornelissen | 328/133 |
| 4,020,422 | 4/1977 | Underhill | 328/133 |
| 4,068,181 | 1/1978 | Clark et al. | 328/133 |

*Primary Examiner*—John S. Heyman
*Attorney, Agent, or Firm*—Thomas A. Briody; William J. Streeter; Edward W. Goodman

[57] ABSTRACT

Phase comparison apparatus, for example for use in phase lock loop (PLL) systems, comprises a first and a second phase comparator. The first comparator has a high gain (e.g. 1000) and a narrow phase difference range (e.g. 5°) and the second phase comparator has a substantially greater range (e.g. 720°). The second phase comparator is automatically switched out when the apparatus is operating in the narrow range and the outputs of the two comparators are proportionately combined in such a way that the combined output characteristic is linear over the whole range covered by the apparatus. The lock-up time of a PLL system using the apparatus is reduced by 10 to 100 times and system noise due to the apparatus can be reduced to negligible proportions.

6 Claims, 15 Drawing Figures

DIGITAL PHASE COMPARISON APPARATUS

This invention relates to digital phase comparison apparatus for comparing the phases of first and second input waveforms to the apparatus. Such apparatus is used in various systems where a signal indicative of the phase difference (increasing or decreasing) between two input signals is required; for example in frequency measurement systems having a high accuracy and in phase lock loops (PLL's). PLL's are used, for example, to lock the frequency of an oscillator on to an input frequency or a multiple or sub-multiple thereof. An example of such use is a frequency synthesiser.

One of the major problems of systems using digital phase comparison apparatus is the noise, or feed-through, generated by the comparison apparatus. This feed-through mainly comprises components of the input signal frequencies which appear on the output of the apparatus. Filters, frequently very complex, are therefore used to reduce the feed-through. The effects of such noise will now be discussed with reference to a particular known application of a digital phase comparator; namely in a PLL used in a frequency synthesiser.

Figure 1:
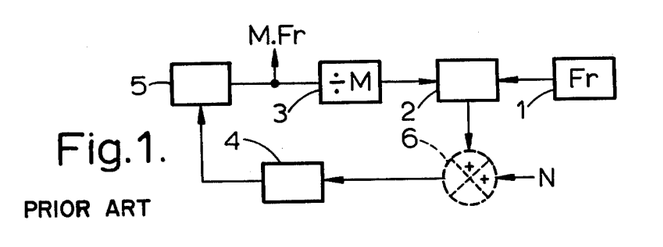
FIG. 1 shows a typical prior art synthesizer circuit.

FIG. 1 of the accompanying drawings shows a typical known frequency synthesiser using a single PLL in which the output frequency is M times a reference frequency Fr derived from a reference souce 1 such as a crystal-controlled oscillator. The output of source 1 is fed to one input of a phase comparator 2 and the output of a ÷M frequency divider 3 is fed to the other input of the frequency comparator. The output of the phase comparator 2 is fed to a loop amplifier and filter unit 4 the output of which controls the frequency of a voltage-controlled oscillator (VCO) 5. The output of VCO 5 forms the synthesiser output and is also fed to the input of divider 3. If the amplifier and comparator phase noise N is assumed to be injected into the system via an adder 6, shown in broken outline, the phase noise $\Delta\phi_{out}$ at the synthesiser output is approximately given, at frequencies below loop cut-off, by $$\Delta\phi_{out} = N \times M / K\phi$$

where $K\phi$ is the gain of the comparator in volts per cycle. In many applications, the reference frequency is in the order of 10 kHz and the output frequency is in the 10's or 100's of MHz range. Thus M is generally very large and the phase noise is very high. A typical phase comparator has a low gain, e.g. 5v/cycle, and the resultant noise causes predominant close-in noise sidebands.

This noise, appearing on the output of amplifier and filter unit 4, causes slight wandering of the frequency of VCO 5. To mitigate this problem, designers have previously used a very narrow bandwidth loop and have relied on the VCO to give the required spectral purity, or have been chosen a multiple-loop solution to reduce M. Multiple loop systems suffer complexity and, in some cases, use several reference oscillators. An example of a multiple loop frequency synthesiser is given in "Frequency synthesiser RY 746 for HF receivers and transmitters", P. Bikker, Philips Telecommunication Review Vol. 30 No. 3, August 1972 and an example of a multi-oscillator synthesiser is given in RCA digital Integrated Circuits Application Note ICAN 6717 page 610.

A PLL is known, for example from U.S. Pat. No. 3,174,090, in which the phase comparator comprises a narrow range (approximately 95°) high gain comparator and a wide range low gain frequency comparator in parallel. When the two input signals have a small phase difference, i.e. in the narrow range, the phase comparator has a high gain $K\phi$ and so the noise $\Delta\phi$ from that comparator is low. This is the normal operating condition since the PLL is locking the phase of the oscillator on to the phase of the reference frequency. When the phase difference is greater than the narrow phase range, e.g. during capture, then the wide range low gain comparator provides the major portion of the output signal. It is to be noted, however, that irrespective of which comparator is providing the phase difference signal, both comparators produce noise in the common output. Thus the inherent advantage of having a high signal-to-noise ratio in the high gain narrow range comparator is largely offset by the noise produced by the low gain wide range comparator.

Other wide range comparators are known which comprise a narrow range (usually 360°) phase comparator and a separate frequency discriminator in order to give wide range coverage. Two separate outputs are provided, that of the phase comparator generally being referred to as the fine control output and that of the frequency discriminator as the coarse control output. The provision of two outputs has various disadvantages. Firstly the equipment controlled by the two outputs, for example a VCO, is complicated due to the fact that it requires two separate input circuits. A smooth changeover in the VCO response from one circuit to the other presents very considerable difficulty. Secondly, measures are necessary, to prevent one control signal from counteracting the effect of the other. Thirdly, noise is produced in each output.

The first disadvantage is present, to a greater or lesser extent, in all phase comparators of the compound type—that is to say comparators which have a central range over which the characteristic curve (input phase difference change $\Delta(\phi_2-\phi_1)$ divided by the corresponding change $\Delta V_{out}$ in the output voltage) is linear and two flanking ranges over which the characteristic curve is non-linear. The abrupt changes in the characteristic curve at the junctions of the central and flanking ranges produce several disadvantages, the main ones being that instability can arise at these junctions and the VCO may overshoot under some circumstances. These disadvantages have higherto only been overcome at the expense of increasing the acquisition time of the PLL. Thus existing designs are a compromise between opposing requirements, as will be evident from the following discussion with reference to FIGS. 2 and 3 of the accompanying drawings.

If the comparator shown in FIG. 1 has a central narrow range high gain linear characteristic i.e. a steep slope position, in order to reduce feed-through, flanked by wider range low gain (gradual or zero slope) characteristics, then when the phase difference $(\phi_2-\phi_1)$—usually referred to as phase error—is small such that the comparator operates on its steep slope portion, the dynamic properties of the PLL are determined in the normal way and, in a properly designed circuit, the lock time can be short. However if the phase error is sufficiently large for the comparator to operate on the flanking slopes, linear operation is not achieved. With a very gradual or zero slope, the loop filter acts as an integrator with a relatively small (substantially fixed) driving voltage at the input. Thus the output of the filter, and hence the VCO, changes relatively slowly in the appropriate direction to minimise the phase error. The upper curve a in each of FIGS. 2 and 3 represents a frequency jump caused by changing the division ratio M in divider 3 of FIG. 1 and the lower curve b shows, on the same horizontal time scale in each case, the resultant change in the control voltage applied to VCO 5.

Figure 2:
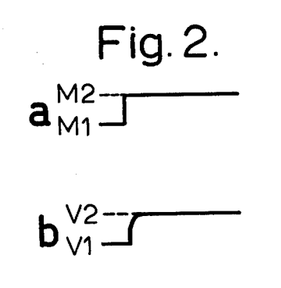
FIGS. 2 and 3 show waveforms for understanding the operation of the circuit of FIG. 1.

FIG. 2 shows a small frequency jump from a locked frequency (phase) M1 to a new frequency (phase) M2 and the corresponding small change V1 to V2 in the control voltage applied to the VCO. The response V1 to V2 is fairly rapid in this case since the jump is assumed to lie within the narrow, steep slope, range of the comparator.

Figure 3:
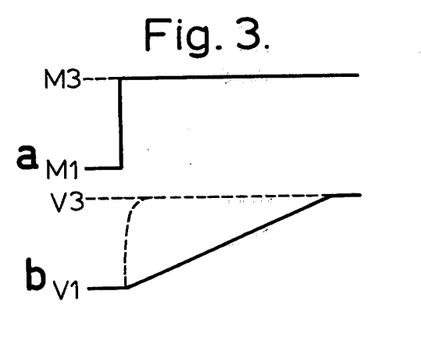

FIG. 3 shows a large frequency (phase) change from M1 to M3 and the corresponding comparatively slow change (unbroken line) in the control voltage from V1 to V3. In this case it is assumed that the frequency change is such as to cause the comparator to operate on one of the flanking portions of the characteristic curve which has a zero slope.

In order to maintain a rapid response as shown in FIG. 2 over the whole of the wide range of the synthesiser, it would theoretically be necessary to extend the steep slope of the characteristic in both directions to cover the whole range linearly. In the case of a very high gain slope, however, the voltage range required would be in the region of a kilovolt or more—which is not practical.

It is the object of the invention to provide digital phase comparison apparatus which at least substantially mitigates all of the abovementioned disadvantages associated with known apparatus.

According to one aspect of the invention there is provided digital phase comparison apparatus, for comparing the phases of first and second input waveforms, comprising a first phase comparator having a phase difference range of less than 180° and a second phase comparator having a phase difference range substantially greater than that of the first phase comparator; means for disconnecting the output of the first phase comparator if the phase difference between the input waveforms is greater than the range of the first comparator and, in this event, for connecting either a first or a second constant voltage level in its place according to whether the phase difference is leading or lagging; means for disconnecting the output of the second phase comparator if the phase difference is within the range of the first comparator; and means for combining either the output of the first comparator or said first and second voltage levels, as the case may be, with the output of the second comparator such that the combined output characteristic is substantially linear over said range of the second phase comparator.

According to another aspect of the invention there is provided digital phase comparison apparatus, for comparing the phases of first and second input waveforms, comprising first and second input terminals for the respective first and second waveforms; a first phase comparator having its inputs connected to said terminals and having a characteristic input-phase-difference/output-voltage curve which is substantially linear between first and second output voltage levels over a first input phase difference range of less than 180°; first means for connecting the output of the first phase comparator to a first intermediate terminal only if the input phase difference is within said range; second means which connects either a first or a second constant voltage level to the first intermediate terminal exclusively if the phase difference is outside said range in either one direction or the other, respectively, the arrangement being such that the two voltage levels and the output of the first phase comparator provide a continuous characteristic curve; a second phase comparator having its inputs connected to said input terminals and having a characteristic curve which is substantially linear over a second phase difference range of $2\pi n$ where n is a positive integer; third means for connecting the output of the second phase comparator to a second intermediate terminal only if the input phase difference is outside the first input range, and combining means for combining signals appearing at the first and second intermediate terminals in such proportion that the combined output characteristic is substantially linear over said second phase difference range.

Apparatus according to the invention thus, in effect, combines three individual characteristics, namely a first narrow range high gain characteristic which is only operative to produce an output if the phase difference between the input waveforms is within the narrow range, a second, constant gain characteristic made up of two portions which maintain constant the end limit voltages of the first characteristic when the phase difference extends beyond the narrow range in either direction—these two characteristics forming a single continuous characteristic, and a third characteristic extending linearly over a substantially wider phase difference range. The third characteristic is proportionately combined with the second characteristic in order to provide a combined characteristic which is substantially linear over the said wider range.

Apparatus according to the invention has the principal advantages that it has very low feed-through indeed when the phases of the two input waveforms are close to each other, and that, when used in feedback control loops such as PLL's, rapid locking may be achieved even when the apparatus has a single output. This considerably simplifies the design of associated equipment.

Preferably, the fourth means for combining the outputs comprises an operational amplifier with a feedback loop. This enables the combining circuit to be very simple indeed (a single respective resistor in each of the two circuits to be combined, the ratio of the resistance values of these resistors determining the combined proportions). Further, if the feedback loop includes a reactance, an active filter is provided which not only serves as an integrater for the output of the second phase comparator but also either eliminates the need for a separate loop filter in PLL's using apparatus according to the invention as the phase comparator or at least considerably simplifies the design thereof.

Various other advantages and features of the invention will become apparent from the following description of an embodiment thereof, taken by way of example, with reference to the accompanying drawings, of which.

Figure 4:
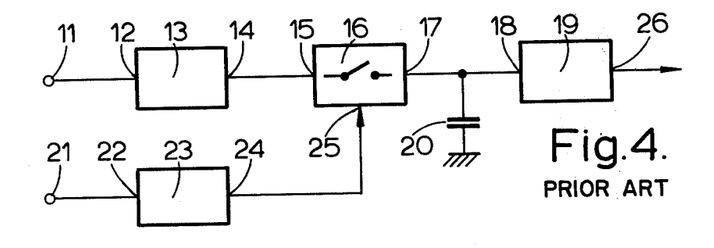
FIG. 4 shows a block schematic circuit diagram of a prior art first phase comparator used in the apparatus according to the invention, showing the basic principle thereof.

Referring now to FIG. 4, an input 11, for the first of the two binary signal waveforms to be compared with respect to phase, is connected to the input 12 of a trapezoidal waveform generator 13 having an output 14 connected to input 15 of a sampling switch 16. The output 17 of switch 16 is connected to the input 18 of unity gain buffer amplifier 19 and also to a storage capacitor 20. An input 21, for the second of the two binary signal waveforms, is connected to input 22 of a sampling pulse generator 23 the output 24 of which is connected to the control input 25 of switch 16. The output 26 of amplifier 18 constitutes the comparator output.

Figure 5:
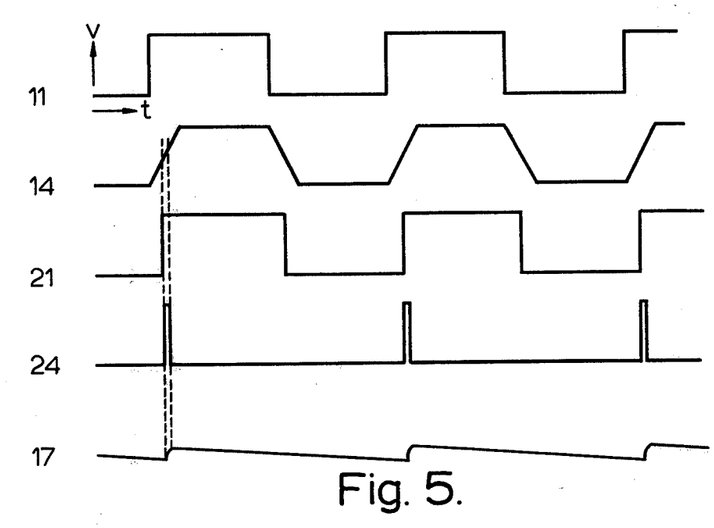
FIG. 5 shows typical waveforms occurring in the operation of the comparator shown in FIG. 4.

The operation of the comparator shown in FIG. 4 will now be described with reference to typical waveforms which may occur therein and which are shown in FIG. 5. Each waveform is given the reference numeral of the circuit point in FIG. 4 at which it appears. Input voltage waveforms to the comparator will typically be as shown at 11 and 21, FIG. 5, after being shaped if necessary. Generator 13 generates waveform 14 in synchronism with at least the rising edge of waveform 11. Pulse generator 23 produces the pulses shown in waveform 24, the leading edge of each pulse being synchronous with the rising edge of the corresponding waveform 21. Each pulse is of a given duration (e.g. 20 nS) less than the duration (e.g. 100 nS) of the rising edge of waveform 14, which edge has a constant slope.

If the two input signals are at the same frequency, for the time that the phase relationship is such that the pulses in the pulse train at 24 occur during the corresponding rising edges of the trapezoidal waveform 14, the average voltage on the hold capacitor 20 will be proportional to the voltage of the rising edge at the sampling instant. As buffer amplifier 19 has a finite input impedance, and capacitor 20 has some leakage, this voltage will decay between samples. In addition, the sampling switch has a parasitic series resistance (not shown in FIG. 2) and the trapezoidal waveform generator 13 has finite output impedance; hence the capacitor will take a certain time to charge up. The waveform 17 shows these features.

The gain of the phase comparator under these conditions is proportional to the steepness of the rising edge slope of the trapezoidal waveform and can therefore be made very high. Thus although the ripple shown in waveform 17 can be regarded as noise, the higher gain of the comparator will result in this ripple modulating a carrier wave, for example, to a lesser degree as indicated by the above equation.

If the repetition rate of the input waveforms is 10 kHz and each has a peak-to-peak amplitude of 10 V and a rise time of the trapezoidal waveform of 100 nS, i.e. the comparator has a phase difference range of less than 1°, the gain of the comparator when sampling during a rising edge is $10^4$ volts/cycle. At the same repetition rate and peak-to-peak amplitude, the gain of a conventional phase comparator which operates linearly over a 360° phase difference range is 10 volts/cycle. In this example an increase in gain of 1000 times has been achieved.

The comparator so far described with reference to FIGS. 4 and 5 is not sensitive to frequency differences between the two input signals. In most practical PLL situations, it will be necessary to make the circuit sensitive to frequency in order to achieve phase lock. A block schematic circuit diagram of an embodiment providing this facility is shown in FIG. 6, in which circuit points and blocks corresponding to those of FIG. 4, are given the same reference numerals.

Figure 6:
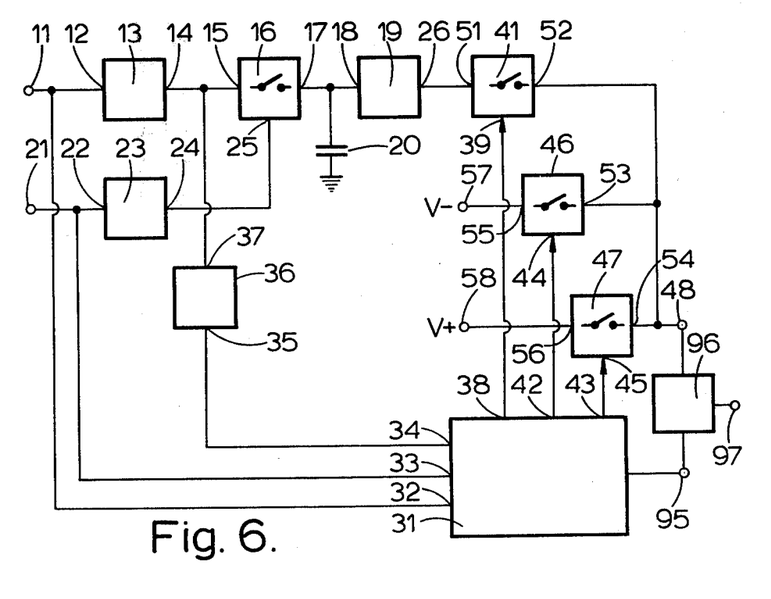
FIG. 6 shows a simplified block schematic circuit diagram of an embodiment of a first apparatus according to the invention.

In FIG. 6, a phase and frequency sensing logic circuit 31 has two inputs 32, 33 to which comparator inputs 11 and 21 are respectively connected and a third input 34 to which the output 35 of a level detector 36 is connected. The input 37 of detector 36 is connected to output 14 of trapezoidal waveform generator 13. An output 38 of logic circuit 31 is connected to the control input 39 of an electronic switch 41. Further outputs 42, 43 of logic circuit 31 are respectively connected to control inputs 44, 45 of two further electronic switches 46, 47. Output 26 of buffer amplifier 19 is connected to output 48 of the comparator via input 51 and output 52 of switch 41. Outputs 53 and 54 of switches 46, 47 are each connected to the comparator output 48 and input 55, 56 of these switches are connected to terminals 57, 58 respectively. In the example given, a negative potential V− (e.g. representing logic "0" level) is connected to terminal 57 and a positive potential V+ (e.g. representing logic "1" level) is connected to terminal 58.

The circuit operation of blocks 13, 16, 19, 20 and 23 in FIG. 6 is the same as that described with reference to FIG. 4. Level detector 36 detects when the voltage at output 14 of the trapezoidal waveform generator 13 reaches its maximum level and provides an output signal at its output 35 to input 34 of logic circuit 31. This signal, together with the input signal waveforms on inputs 32 and 33 provides sufficient information for the logic circuit to detect the condition that the leading edge of the waveform on input 21 arrives during the rise time of the trapezoidal waveform on the output of generator 13. Alternatively, of course, the output 24 of pulse generator 23 could be connected to input 33 of logic circuit 31 to give the instant of arrival of the leading edge of the waveform at input 21. On detecting the above condition, logic circuit 31 provides a signal on its output 38 to operate electronic switch 41 and, hence, to connect the output 26 of buffer amplifier 19 to the output 48 of the comparator. This if the two input signal waveforms have the same frequency and have a phase relationship such that the sampling pulse occurs during the rise time of the trapezoidal waveform, then switch 41 is closed and the circuit functions in the manner described with reference to FIG. 4.

Logic circuit 31 also includes a frequency difference detector which operates to provide a signal at its output 42 or 43 respectively, according to whether the frequency of a signal at input 11 is less or greater than the frequency of the signal at input 21. Thus if the repetition rates of the waveforms appearing at inputs 11 and 21 are $f_1$ and $f_2$ respectively, then logic circuit 31 operates switch 46 if $f_1 > f_2$ and operates switch 47 if $f_2 > f_1$. Only one of switches 41, 46 and 47 can be operated at any one time.

As stated previously, the gain of the comparator is a direct function of the steepness of the slope of the trapezoidal waveform. If the slope concerned extends over 180° of the waveform being compared, then only twice the gain is achieved compared with that of the conventional 360° linear comparator. To achieve a useful increase in gain, the ramped leading edge of the phase comparator occupies less than 180° of the waveform being compared; preferably less than 5°.

If, on switching on a PLL using the phase comparator so far described, the sampling pulses occur other than during the rising slope of the trapezoidal waveform, then the "1" or "0" output on terminal 48 causes the VCO in the PLL to change its frequency in the appropriate direction. If the initial starting conditions are such that none of the switches operates immediately, natural variations in the oscillator frequency assures, in practice, that one of the switches operates within a couple of cycles of the input waveform and the PLL is then driven towards the locked state.

Figure 7:
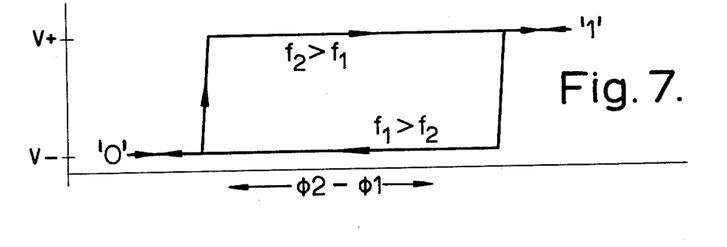
FIG. 7 shows the phase/voltage characteristic of the embodiment shown in FIG. 6.

If the voltage on capacitor 20 in FIG. 6 can vary between V+ and V−, then the voltage/phase characteristic of the comparator is as shown in FIG. 7, in which the oridinate is the phase difference $\phi_2 - \phi_1$ between the two input waveforms. As can be seen from this FIG., the output voltage is either V+ or V− or is linearly variable therebetween where the phase difference is such that the sampling pulses occur during the rising edge of the trapezoidal waveform.

Obviously, the falling edge of the trapezoidal waveform 14 (FIG. 5) could be used instead of the rising edge in the foregoing embodiment.

In addition to the phase comparator so far described, FIG. 6 includes a second phase comparator (not shown separately) part of which is common to the phase and frequency sensing logic circuit 31. This second phase comparator has a wider linear range, of $2\pi$ n (preferably $4\pi$), where n is a positive integer than the first phase comparator and the output of the second phase comparator appears at terminal 95. The output is however, disconnected from terminal 95 so long as switch 41 is operated—as will be described hereinafter. The outputs appearing at terminals 48 and 95 are combined in a combining unit 96 and the combined output appears at terminal 97.

Figure 8:
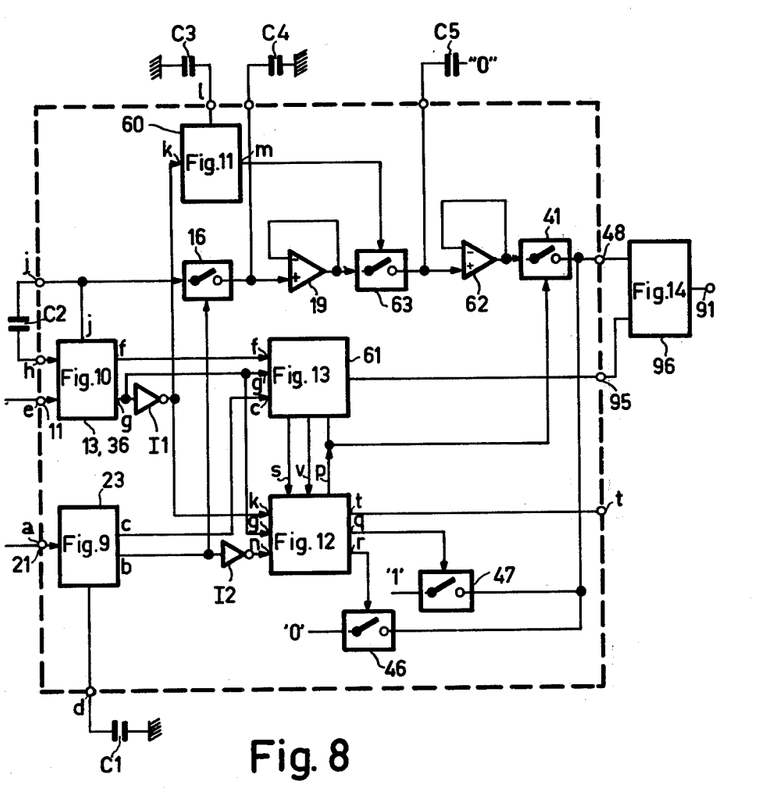
FIG. 8 shows a block schematic diagram of a preferred embodiment of apparatus according to the invention.

FIG. 8 is a block schematic diagram of a practical embodiment of digital phase comparison apparatus according to the invention, which apparatus uses a falling slope for sampling, and FIGS. 9 to 14 are circuit diagrams of the circuit blocks given in FIG. 8. In each of FIGS. 8 to 14, lower case letters are used for referencing the various interconnecting leads between circuit components. Items in FIG. 8 which correspond to similar items in FIG. 6 are given the same reference numerals in both Figures.

As can be seen, FIG. 8 is generally similar to FIG. 6, the additional major items being a second sampling pulse generator 60, a second phase comparator 61, an additional buffer amplifier 62 and an additional electronic switch 63. In that the apparatus can largely be constructed from standard integrated circuit blocks, as will be described later, at least the major part of the circuit apart from capacitors C1 to C5 and various resistors can be integrated in monolithic form; this being represented by the enclosing broken line. Capacitor C4 is the equivalent of capacitor 20 in FIG. 6.

The operation of the apparatus will now be described with reference to FIGS. 8 to 14. The input signal waveforms to be compared are fed to the comparator via leads a and e connected to terminals 21 and 11 respectively. Sampling pulse generator 23 of FIG. 8 is shown in detail in FIG. 9 and comprises three two-input NOR gates 64, 65, 66, a resistor R1 and a capacitor C1. NOR gates 64 and 65 have their inputs connected together and thus act as simple inverters. A rising ('0'→'1') edge of an input waveform applied to input lead a produces a falling ('1'→'0') edge on the upper input (as viewed in the Figure) of gate 66 and gate 65 produces a rising ('0'→'1') edge at output lead c. The voltage across capacitor C1 is initially at logic level '0' and hence the output of gate 66 goes to '1'. Capacitor C1 immediately starts charging and, after a period dependant upon the value of capacitor C1 and resistor R1 the voltage across it approaches logic '1'. The output of gate 66 thereupon goes to '0'. Thus a pulse is produced on lead b on each occurrence of a rising edge of the input waveform on lead a, the duration of this pulse being controlled by the capacitance value of capacitor C1. In practice, a pulse width of a few nanoseconds was used for the sampling pulse. This pulse operates the sampling switch 16 (FIG. 8) to sample the waveform generated by waveform generator 13 (on lead j).

The waveform appearing on lead c, synchronous with the waveform on lead a, is fed to the second phase comparator 61 to serve as one input waveform therefor. The output pulse on lead b is inverted by inverter I2 and supplied to the frequency-sensing logic circuit 31 via lead n.

Figure 10:
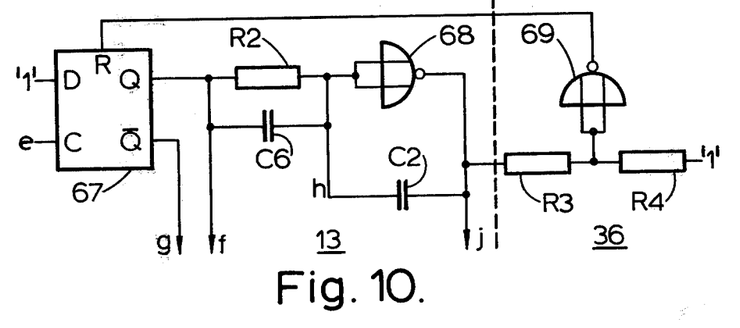
Figure 11:
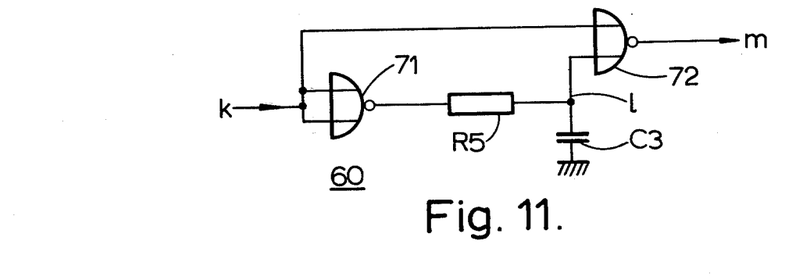

FIG. 10 shows the combined circuit of waveform generator 13 and level detector 36 which circuit comprises a rising-edge-triggered delay flip-flop 67 having a delay input D, a clock input C, a reset input R, and complementary outputs Q and $\overline{Q}$. The Q output is fed, via lead f, to an input of second phase comparator 61 and to an inverter-connected NOR gate 68 via the parallel arrangement of a capacitor C6 and a resistor R2 and lead h. The output of gate 68 is connected to '1' via a voltage divider comprising resistors R3 and R4 the junction point of which is connected to the inputs of an inverter-connected NOR gate 69. The output of gate 69 is connected to the reset input R of flip-flop 67, a '1' being permanently provided on the D input thereof. Resistors R3, R4 and gate 69 constitute the level detector 36 of FIG. 6. It is to be noted in the following description that all device inputs not shown connected in the Figures, e.g. the normal set input S of flip-flop 67 in FIG. 10, are assumed to be held at '0'. The output lines h and j are connected to a capacitor C2.

If it is assumed that the Q output of flip-flop 67 is initially at '0' this output goes to '1' (the input on D) immediately a rising ('0'→'1') edge of the input waveform on lead e appears at the clock input C. This '1' appearing on lead h at the input of gate 68, which gate functions as an inverter, drives the gate output on lead j towards '0' at a rate dependent upon the capacitance value of capacitor C2. Up to this point, lead j was at '1' and hence the output of gate 69 was at '0'. The value of resistors R3 and R4 are so proportioned with respect to the switching voltage level of gate 69 that gate 69 switches to provide a 1 output to the reset input R of flip-flop 58 when the falling slope generated by gate 68 and capacitor C2 has reached a predetermined level. In this way, a falling slope of a predetermined duration is generated on output lead j immediately on arrival of the rising edge of the input waveform on lead e. It is this falling slope which is sampled by the sampling pulses generated at each rising edge of the other input waveform (on lead a, FIGS. 8 and 9) and the duration of this slope is considerably greater than that of the sampling pulses. As soon as the '1' from gate 69 appears on reset input R of flip-flop 67, the latter is reset and provides a '0' on the Q output, whereupon capacitor C2 discharges until a point is reached when the output of gate 69 goes to '0' again and removes the reset '1' input to flip-flop 67. Thus the $\overline{Q}$ output of flip-flop 67 on lead g goes to '0' and the Q outputs on lead f goes to '1' for the duration of the generated falling slope and provide slope duration information to the second sampling pulse generator 60, to logic circuit 31, and to the second phase comparator 61.

Figure 9:
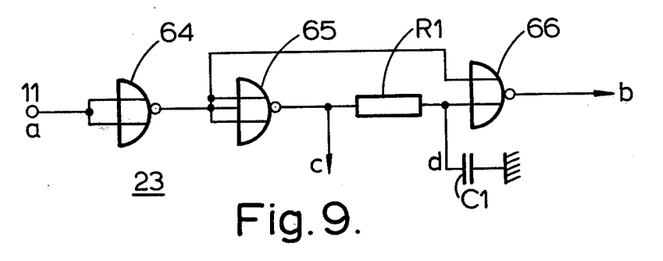
FIGS. 9 to 14 show detailed circuit diagrams of circuit blocks given in FIG. 8.

The output on lead j is sampled by switch 16 and fed to buffer amplifier 19 as described with reference to FIG. 6. The output of amplifier 19 is as shown in waveform 17 of FIG. 3 and is fed to the input of a sampling switch 63. This switch is controlled by a second sampling pulse generator 60 (FIGS. 8 and 11) comprising two NOR gates 71, 72 a resistor R5, and a capacitor C3. This pulse generator functions in a similar manner to that of FIG. 9 except that in this case, the equivalent of inverter 64 of FIG. 9 is not provided, with the result that a sampling pulse is provided on receipt of a falling edge of waveform k, i.e. at the end of the falling slope. The sampling pulse on lead m controls switch 63. The width of the sampling pulse is controlled by the values chosen for capacitor C3 and resistor R5. To summarise the foregoing, a first series of sampling pulses coincident with the rising edges of the input waveform and lead a is generated by first sampling pulse generator 23 (FIGS. 8 and 9) and a second series of sampling pulses is generated by second sampling pulse generator 60 (FIGS. 8 and 11) at the end of the falling slopes. This further sampling of the waveform 17 has the effect of reducing the a.c. component (ripple), since the width of the second sampling pulses can be considerably greater than that of the first sampling pulses. Thus more time can be taken to charge integrating capacitor C5 with the result that this capacitor may have a larger capacitance than C4 and the ripple is considerably reduced. In practice, the ripple component can be reduced to a minimum which is limited only by the switching crosstalk from the switch. The signal on capacitor C5 is then passed via buffer amplifier 62 to switch 41.

Figure 12:
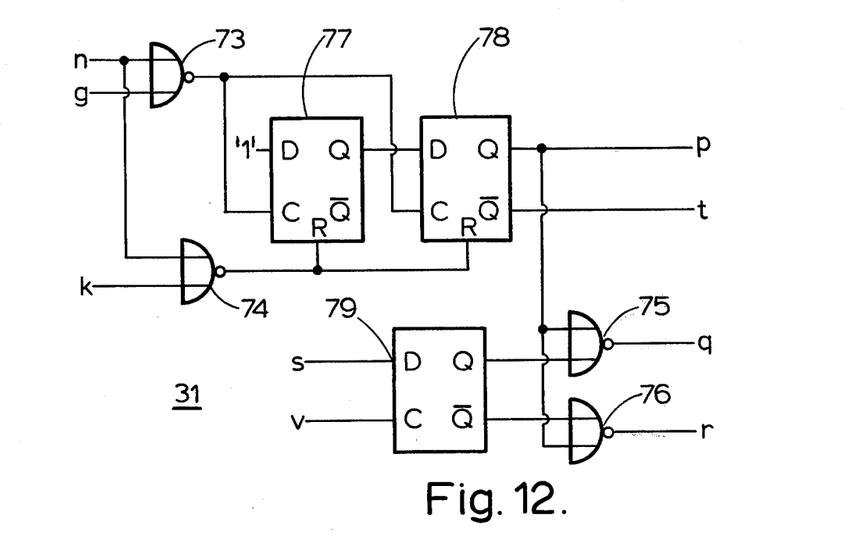

FIG. 12 shows the circuit details of the frequency-sensing logic circuit 31 of FIG. 8 and comprises four NOR gates 73 to 76 and three D-type flip-flops 77 to 79. Due to inverter I2 (FIG. 8), the signal on lead n is a '0' during the '1' sampling pulses on lead b. As explained with reference to FIG. 10, the signal on lead f is a '1' and the signal on lead g is a '0' during the falling slope period. Thus if the sampling pulse occurs during this period, a '1' pulse appears on the output of gate 73 in synchronism with the sampling pulse. This causes flip-flops 77 and 78 to set (if not already on the set state) due to the permanent '1' on the D input of flip-flop 85.

The signal on lead k, derived from the signal on lead g via inverter I1, is a '1' during the falling slope period and, hence, gate 74 is inhibited for this period. Sampling pulses ('0' on lead n) occurring during this period are therefore blocked by gate 74. If a sampling pulse occurs at any time other than during the falling slope, gate 74 is enabled and the '1' on its output resets flip-flops 77 and 78 (if not already in the reset state). Thus the signal on lead p is a '1' if sampling takes place during the period of the falling slope and the signal on read t is a '1' at all other times. Gates 75 and 76 are therefore inhibited if sampling occurs during the period of the falling slope and electronic switches 46 and 47 (FIG. 8) cannot be operated. Electronic switch 41 is operated during this period by the '1' on lead p and the signal sample present on the output of buffer amplifier 62 is fed to output terminal 48. Conversely, if the sampling pulses occur at any other time than during the period of the falling slope, then the '0' on lead p prevents the operation of switch 41 and enables switches 75 and 76 to respond to the Q and $\overline{Q}$ outputs of flip-flop 79. The operation of flip-flop 79 depends upon the operation of the second phase comparator 61 shown in detail in FIG. 13. Inverters I1 and I2 are two-input NAND gates with their respective inputs strapped together.

Figure 13:
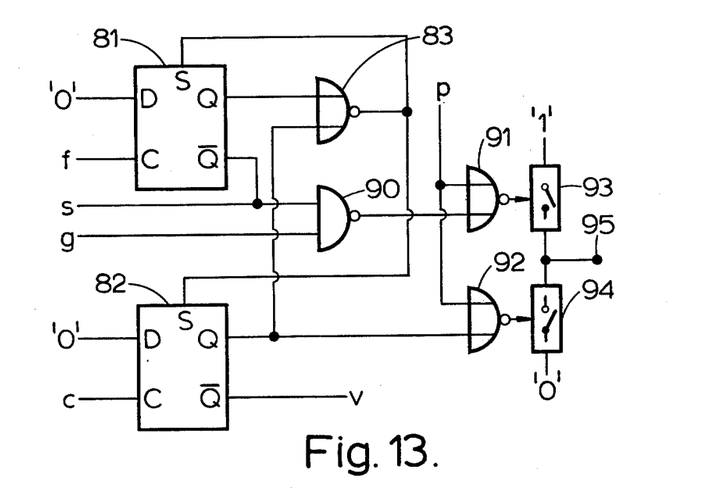
Figure 14:
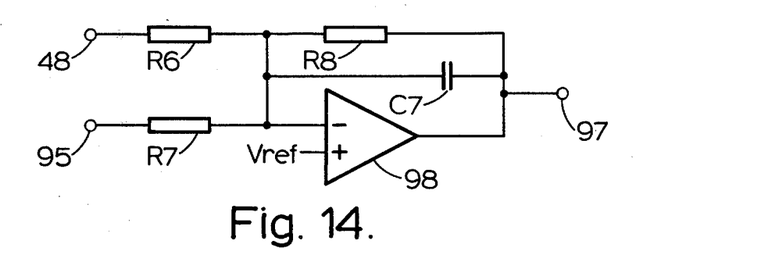

Referring now to FIG. 13, the second phase comparator shown includes a known comparator comprising two flip-flops 81, 82 and a NOR gate 83 the output of which is connected to the S (set) inputs of both flip-flops. The Q outputs of flip-flops 81, 82 are connected to respective inputs of gate 83. The clock (C) input to flip-flop 81 is connected via lead f to an output of FIG. 8 which rises to '1' synchronously with the rising edge of signal input waveform on lead e. The clock input of flip-flop 82 is connected via lead c to an output of the sampling pulse generator 23 (FIG. 7) which rises to '1' synchronously with the rising edge of the input signal waveform on lead a. Thus the arrangement effectively compares the two signal input waveforms. The $\overline{Q}$ outputs of flip-flops 81 and 82 provide signals on leads s and v respectively to D-type flip-flop 79 of FIG. 12. Lead s is connected to one input of a NAND gate 90 the other input of which is connected via lead g to the $\overline{Q}$ output of flip-flop 67 (FIG. 10). The output of gate 90 is connected to one input of a NOR gate 91. The other input of gate 91 is connected, in parallel with one input of a further NOR gate 92, to the output of a NOR gate 78 (FIG. 12) via lead p. The other input of NOR gate 92 is connected to the Q output of flip-flop 82. The outputs of gates 92 and 93 control respective electronic switches 93 and 94. When operated, switch 93 connects a '1' signal to output 95 and switch 94 connects a '0' to terminal 95. Terminals 48 (FIG. 8) and 95 are connected to inputs of the combining circuit 96 (FIGS. 8 and 14).

As explained above with reference to FIG. 12, the signal on lead p is a '1' if sampling takes place during the period of the falling slope. Thus NOR-gates 91 and 92 are inhibited under this condition and neither of switches 93 and 94 can be operated. Thus a signal can only appear on terminal 95 when sampling is not occurring during the falling slope period.

The operation of switches 46, 47, 93 and 94 basically depends upon the second phase discriminator largely formed by flip-flops 81, 82 and NOR gate 83. If it is first assumed that the leading (i.e. rising) edge of the waveform on lead f leads that on lead c (referred to as the 'phase advanced' state) and that flip-flops 81, 82 are in the set (Q='1') state, then flip-flop 81 is reset (Q='0') by the rising edge of lead f. Flip-flop 82 is then reset by the rising edge on lead c. As soon as it does so, the two '0' inputs to gate 83 enable this gate and its '1' output sets each of the flip-flops 81, 82 back to the set state (Q='1') again. Thus a '1' pulse appears on the $\overline{Q}$ output of flip-flop 81 having a duration (pulse width) equal to the period between the leading edges of the waveforms on leads f and c, and '1' pulse of extremely short duration (the switching times of gate 83 and flip-flop 82) appears on the $\overline{Q}$ output of flip-flop 82 synchronous with the leading edge of the waveform appearing on lead c. Thus the width of the '1' pulse on the $\overline{Q}$ output (lead s) of flip-flop 81 is directly proportional to the lead phase difference between the two inputs on leads f and c. If it is now assumed that the leading edge of the signal waveform on lead f lags that on lead c (referred to as the 'phase retarded' state) and that flip-flops 81 and 82 are in the set (Q='1') state, then flip-flop 82 is reset first followed by flip-flop 81 whereupon, in the manner described above both flip-flops are set again by gate 83. Thus the width of the '1' pulse on the $\overline{Q}$ output (lead v) of gate 82 is directly proportional to the lagging phase difference between the two inputs.

The $\overline{Q}$ outputs of flip-flops 81 and 82 are respectively fed to the D and C inputs of flip-flop 79 (FIG. 12) via respective leads s and v. Summarising the operation of flip-flops 81 and 82 (FIG. 13), a short '1' pulse appears on lead v at the end of a '1' pulse on lead s for the phase advanced state and vice versa for the phase retarded state. Thus flip-flop 79 is permanently set (Q='1') during the phase advanced state and permanently reset (Q='0') in the phase retarded state. The Q and $\overline{Q}$ outputs of flip-flop 79 are fed to respective inputs of two NOR gates 75 and 76, the other inputs of these gates being fed from the Q output (lead p) of flip-flop 78. As explained previously, the signal on lead p is '1' if sampling occurs during the falling slope period and '0' at all other times; so gates 75 and 76 are inhibited if sampling occurs during the falling slope period. As a result, switches 46 and 47 (FIG. 8) cannot operate during this period. In the phase advanced state, the Q and $\overline{Q}$ outputs of flip-flop 79 are '1' and '0' respectively if sampling takes place other than during the falling slope with the result that the signal on lead r is '1' and switch 46 is operated to give a '0' at terminal 48 (FIG. 8). Thus, for the phase advanced state, switch 41 is operated if sampling occurs during the falling slope period to provide the sampled output of terminal 48 and if sampling occurs at any other time (i.e. if the phase lead is greater than that represented by the falling slope period) switch 46 holds terminal 48 at '0'. For the phase retarded state, gate 75 is enabled and operates switch 47 if sampling occurs other than during the falling slope period. Thus a '1' appears on terminal 48 under this condition and the output characteristic at terminal 48 described with reference to FIGS. 8 to 13 is as shown in FIG. 7.

The output '1' signal on lead t, FIGS. 8 and 12, can be used if required as an indication signal that the comparator is "out of lock" in a PLL system; that is to say that sampling is not occurring during the falling slope period.

Figure 15:
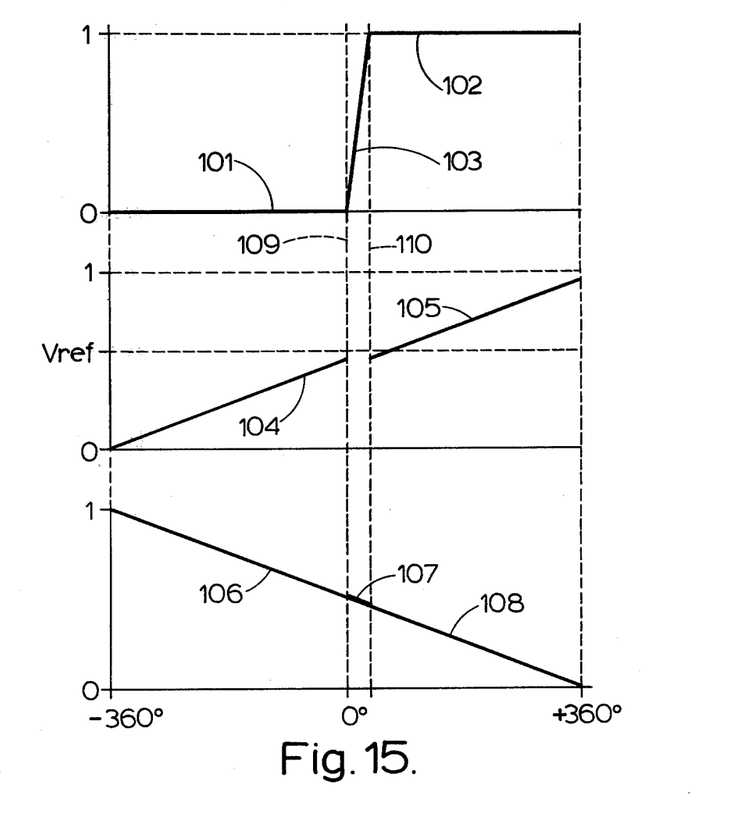
FIG. 15 shows how the various phase/voltage characteristics are combined to provide a linear output characteristic.

The second phase comparator further includes the NAND gate 90 and NOR gates 91 and 92. As explained above with reference to FIG. 10, the signal on lead g is '0' during the falling slope period and '1' at all other times. Thus during the falling slope period, the outputs of gates 90 and 91 are held at '1' and '0' respectively. Thus switch 93 cannot operate during the falling slope period. At all other times the signal on lead g is '1' and NAND gate 90 acts as an inverter for the signals on lead s described above. The signal on lead p is '0' under this condition and gate 91 therefore also acts as an inverter. Thus switch 93 produces pulses each of which has a period (pulse-width) which is equal to the period of the signal on lead s minus the period of the falling slope. Thus the output at terminal 95 in the phase advanced state can never reach a permanent '1' when the phase difference between the input signals reaches 360° since switch 93 is always opened for the period of the falling slope. This is shown in FIG. 15, which will be described hereinafter.

In the phase retarded state, the width of a '1' pulse on lead v is directly proportional to the lagging phase difference between the signals on leads f and c, as stated above. The inverse of signal v is applied to gate 92 from the Q output of flip-flop 82. The signal on lead p outside the falling slope period is '0' and hence gate 92 acts as an inverter so that the input to switch 94 is effectively the signal v. Therefore '0' pulses appear at terminal 95 with a pulse width directly proportional to the lagging phase difference (0° to 360°) between the signals on leads f and c. The second phase comparator thus has a 720° range.

The signals appearing at terminals 48 and 95 are proportionately combined and integrated in combining circuit 96 (FIG. 8), a possible embodiment of which is shown more in detail in FIG. 14. As can be seen from FIG. 14, the combining circuit is a conventional active filter comprising an operational amplifier 98, input proportioning resistors R6, R7 respectively connected between terminals 48, 95 and the inverting (−) input of amplifier 98, a reactive (RC) feedback network, formed by a capacitor C7 and a resistance R8, connected between the output of amplifier 98 and its inverting input, the output of amplifier 98 being connected to apparatus output terminal 97. The non-inverting (+) input of amplifier 98 is connected to a reference voltage $V_{ref}$ which has a value slightly greater than half the voltage represented by logic level '1'.

If the gain, in volts per cycle, of the first phase comparator at terminal 48 is K1 and the gain of the second phase comparator at terminal 95 is K2, and R6 and R7 are chosen such that R6/R7=K1/K2, then the outputs at terminals 48 and 95 are combined to give a linear characteristic over the 720° range despite the fact that the first phase comparator has a very high gain and, hence, very low noise. This will now be explained with reference to FIG. 15, in connection with which it is to be noted that the width of the region representing the falling slope period is very greatly magnified in order to show it clearly. In practice, it would hardly be noticeable on such a scale since its width is considerably less than 1° of phase difference in order to provide a very high gain (e.g. 1000 time K2) over this portion.

FIG. 15 shows the component and composite characteristic slopes of the apparatus over a phase difference ($\phi2-\phi1$) range from −360° to +360°. Curves 101 and 102 show the d.c. levels produced by switches 46 and 47 respectively and the linear slope 103 between them shows the high gain narrow band characteristic produced, by sampling switch 16 with switch 41 operated. Curves 104 and 105 show the contribution to the combined slope produced by switches 94 and 93 respectively. Resistors R6 and R7 of combining circuit 96 (FIG. 14) are proportioned such that the slopes 103 and 104, 105 are equal in the combined signal. For the sake of simplicity it has been assumed that in FIG. 15 resistors R7 and R8 have the same value so that the combined output slope extends from '0' to '1'. The d.c. levels 101, 102 then "offset" the slopes 104, 105 such that the combined characteristic is linear over the 720° range as shown by the curves 106, 107, 108. The slopes of curves 106, 107, 108 are reversed with respect to the slopes of respective curves 103, 104, 105 since the circuit shown in FIG. 14 acts as an inverter. Broken lines 109 and 110 define the region in which sampling is effected during the period of the falling slope.

It will be appreciated that the second phase comparator may have a phase difference range of other than 720° (4π), namely 2πn where n is a positive integer.

It will also be appreciated from the foregoing that, although the input-phase-difference/output volts characteristic is substantially linear over the whole range of the apparatus—i.e. of the second phase comparator, the gain of the first comparator can be made very high indeed. Thus there is very little noise generated by the apparatus in a PLL when in the locked state. Under this condition, of course, no noise can be generated by the second phase comparator since it is switched out of circuit.

The various gates, delay flip-flops, switches and amplifiers shown in FIGS. 9 to 14 and used in a practical embodiment were commercially available integrated circuit blocks as follows:

Quad NOR-gate, Motorola Type MC14001
64, 65, 66, 68, 69, 71, 72, 73, 74, 75, 76, 83, 91, 92.
Quad NAND-gate, Motorola Type MC14011
I1, I2, 90.
Dual D-type flip-flop, Motorola Type MC14013
67, 77, 78, 79, 81, 82.
Quad Analogue Switch, Motorola Type MC14016
16, 41, 46, 47, 63, 93, 94.
Operational Amplifier, RCA Type CA3130.
19, 62, 98.

The various resistance and capacitance values used were as follows:

| R1 — 1 kOhm | C1 — 100 pF |
|---|---|
| R2 — 4.7 kOhm | C2 — 100 pF |
| R3 — 4.7 kOhm | C3 — 470 pF |
| R4 — 10 kOhm | C4 — 22 pF |
| R5 — 3.3 kOhm | C5 — 820 pF |
| R6 — 4.7 MOhm | C6 — 120 pF |
| R7 — 4.7 kOhm | |

In the practical embodiment, it was found that the addition of the wide-range low gain comparator characteristic to the narrow-range high gain comparator characteristic resulted in the time taken by a frequency synthesiser to reach its new frequency output was reduced by at least ten times. This is represented by the broken line curve in FIG. 3.

In the particular embodiments of the invention described, the range of the second phase comparator is 720°. Obviously, other ranges—larger or smaller—could be used provided that this range is substantially greater than the range of the first phase comparator. Further, alternative types of phase comparator may be used for the second phase comparator, for example a sample-and-hold type or a diode bridge type, with appropriate modification.

What is claimed is:

1. Digital phase comparison apparatus for comparing the phases of first and second input waveforms, said apparatus comprising a first phase comparator having input means for receiving said input waveforms and an output means for providing a signal when a phase difference range of less than 180° exists between said input waveforms; a second phase comparator having input means for receiving said input waveforms and an output means for providing a signal over a range of input waveform phase differences substantially greater than that of the first phase comparator; means for disconnecting the output means of the first phase comparator when the phase difference between the input waveforms is greater than the range of the first comparator and for connecting one of a first and a second constant voltage level in place of said first phase comparator in accordance with whether the phase difference is leading or lagging respectively; means for disconnecting the output means of the second phase comparator when the phase difference is within the range of the first comparator; and means for combining one of the output of the first comparator, said first voltage level, and second voltage level with the output of the second comparator such that the combined output characteristic is substantially linear over said range of the second phase comparator.

2. Digital phase comparison apparatus for comparing the phases of first and second input waveforms, said apparatus comprising first and second input terminals for the respective first and second waveforms; a first phase comparator having its inputs connected to said terminals and having a characteristic input-phase-difference versus output-voltage curve which is substantially linear between first and second output voltage levels over a first input phase difference range of less than 180°; first means for connecting the output of the first phase comparator to a first intermediate terminal only when the input phase difference is within said range; second means which connects one of a first and a second constant voltage level to the first intermediate terminal exclusively when the phase difference is outside said range in accordance with the direction said phase difference is outside said range respectively, the two voltage levels and the output of the first phase comparator providing a continuous characteristic curve; a second phase comparator having its inputs connected to said input terminals and having a characteristic curve which is substantially linear over a second phase difference range substantially greater than that of the first phase comparator; third means for connecting the output of the second phase comparator to a second intermediate terminal only when the input phase difference is outside the first input range, and combining means for combining signals appearing at the first and second intermediate terminals in such proportion that the combined output characteristic is substantially linear over said second phase difference range.

3. Apparatus as claimed in claim 1 wherein the first phase difference range is less than 5°.

4. Apparatus as claimed in claim 1, wherein the second phase difference range is 2πn, where n is a positive integer.

5. Apparatus as claimed in claim 1 wherein the combining means comprises an active network having a feedback circuit.

6. Apparatus as claimed in claim 5, wherein the feedback circuit includes a reactance element.

* * * * *